United States Patent [19]
Matsui

[11] Patent Number: 5,805,506
[45] Date of Patent: Sep. 8, 1998

[54] SEMICONDUCTOR DEVICE HAVING A LATCH CIRCUIT FOR LATCHING DATA EXTERNALLY INPUT

[75] Inventor: Yoshinori Matsui, Tokyo, Japan

[73] Assignee: NEC Corporation, Tokyo, Japan

[21] Appl. No.: 857,828

[22] Filed: May 16, 1997

[30] Foreign Application Priority Data

May 22, 1996 [JP] Japan .................................... 8-126977

[51] Int. Cl.⁶ ............................................... G11C 7/00
[52] U.S. Cl. .................... 365/189.05; 365/193; 365/233
[58] Field of Search ................... 365/230.02, 230.08, 365/230.04, 233, 191, 193, 189.05

[56] References Cited

U.S. PATENT DOCUMENTS

| | | | |
|---|---|---|---|
| 5,521,878 | 5/1996 | Ohtani et al. | 365/233 |
| 5,521,879 | 5/1996 | Takasugi | 365/233 |
| 5,610,864 | 3/1997 | Manning | 365/193 |
| 5,726,950 | 3/1998 | Okamoto et al. | 365/233 |

*Primary Examiner*—Son Mai
*Attorney, Agent, or Firm*—McGinn & Gibb, P.C.

[57] ABSTRACT

To use a high performance central processing unit (CPU) (e.g., operating with high frequency), a memory system includes a memory cell array having a plurality of word lines connected to memory cells, a latch circuit for receiving and latching a first control signal in response to a first clock signal and for outputting a second control signal, and a decoder for selecting one word line among the word lines in response to an address signal when the decoder receives the second control signal. The latch circuit includes a first latch portion for latching the first control signal during a first cycle of the first clock signal, and a second latch portion for latching the first control signal during a second cycle of the first clock signal.

23 Claims, 12 Drawing Sheets

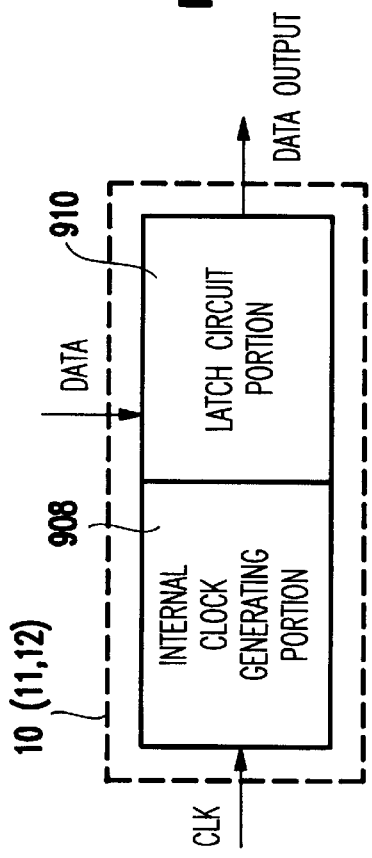
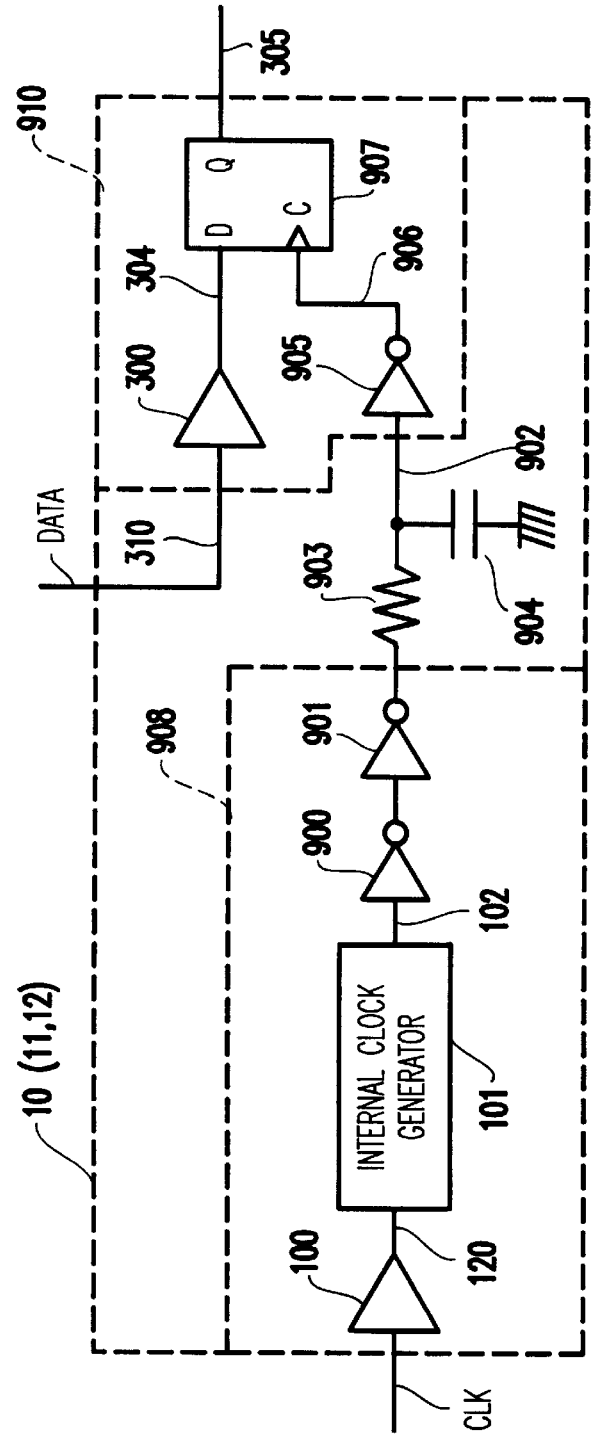

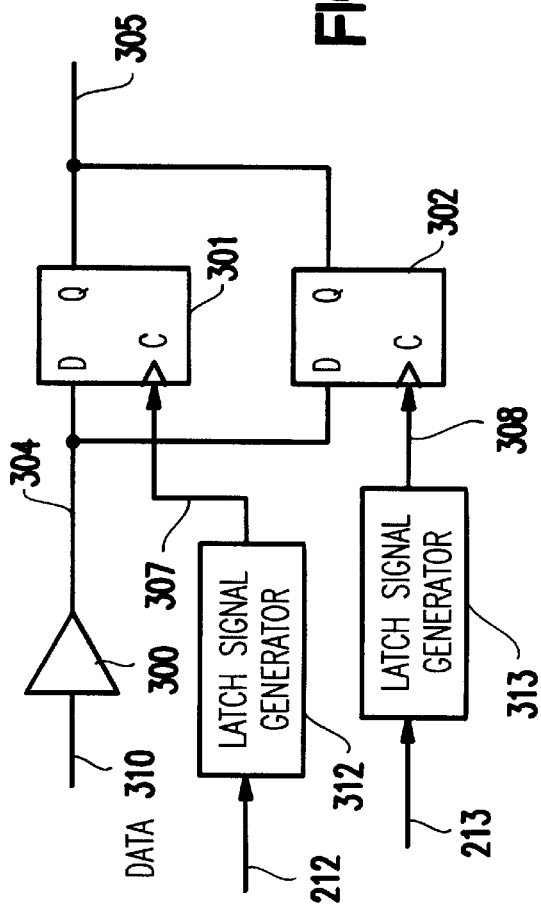
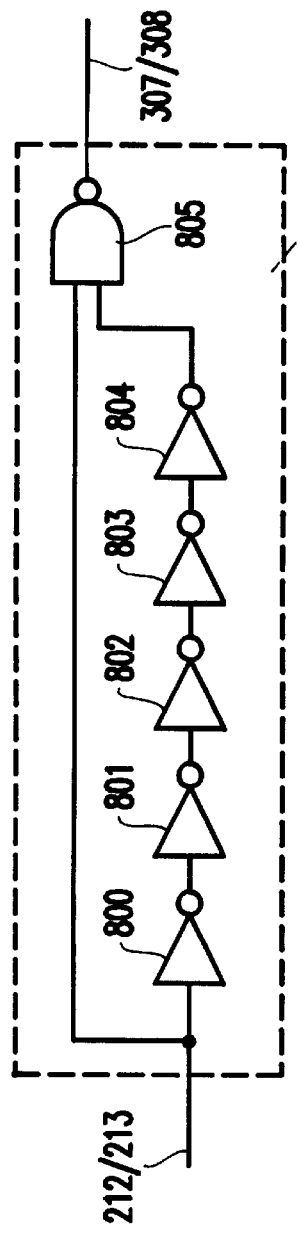
FIG.13
FIG.14

SEMICONDUCTOR DEVICE HAVING A LATCH CIRCUIT FOR LATCHING DATA EXTERNALLY INPUT

BACKGROUND OF THE INVENTION

The present invention generally relates to a semiconductor device having a latch circuit for latching data externally input, and more particularly to a logic circuit included in the latch circuit.

1. Description of the Related Art

When a memory device is connected to an external central processing unit (CPU), the memory device needs to synchronize with the CPU. Therefore, normally, a latch circuit, functioning as a buffer, is formed in the device (e.g., a synchronous dynamic random access memory (DRAM)) for latching data from the CPU in response to a clock signal outputted by the CPU.

FIG. 1 shows a conventional (e.g., it is related art but it is not prior art) single-chip DRAM device 1 and a CPU 2 for operating the device 1. The CPU 2 receives instructions (unreferenced), and operates the device 1 in response to the instructions. To operate the device 1, the CPU outputs an address signal, a clock signal (CLK), a row address strobe (RAS) signal, a column address strobe (CAS) signal, and a write enable (WE) signal. Further, the CPU 1 receives data from the device 1 in a reading operation for reading the data from the device, and outputs data to the device 1 in a writing operation for writing the data to the device 1.

The device 1 includes a memory cell array 4, a row decoder 3, a column decoder 6, a sense amplifier 6, an input buffer 7, an output buffer 8, an address latch circuit 9, a RAS latch circuit 10, a CAS latch circuit 11, and a WE latch circuit 12. There are a plurality of terminals (unreferenced) corresponding to the circuits 9–12.

The address latch circuit 9, the RAS latch circuit 10, the CAS latch circuit 11 and the WE latch circuit 12 respectively receive and latch the address signal, the clock signal, the RAS signal, the CAS signal and the WE signal according to the CLK signal. The latch circuits 10–12 have the same construction, and the address latch circuit 9 includes a plurality of the same structures as the latch circuits 10–12.

The memory cell array 4 comprises a plurality of word lines, bit lines and memory cells (e.g., DRAM cells).

The row decoder 3 decodes a row address contained in the address signal in response to the RAS signal. When the RAS latch circuit 10 outputs an active level (e.g., "0"), the row decoder decodes the row address and activates one word line in the memory cell array 4.

The column decoder 6 decodes a column address contained in the address signal in response to the CAS signal. When the CAS latch circuit 11 outputs an active level (e.g., "0"), the column decoder decodes the column address and activates corresponding bit lines (e.g., columns) in the memory cell array 4.

The sense amplifier 5 amplifies data from a memory cell selected by the row decoder 3 and the column decoder 6, and outputs the amplified data to the output buffer 8 in the reading operation. In the writing operation, the sense amplifier 5 receives data from the input buffer, and amplifies the data. The amplified data is written to a memory cell selected by the row decoder 3 and the column decoder 6.

The output buffer 9 is activated when the WE latch circuit outputs an inactive level (e.g., "1"), and outputs data from the sense amplifier 5 to the CPU 2. The input buffer 7 is activated when the WE latch circuit outputs an active level (e.g., "0"), and outputs data from the CPU 2 to the sense amplifier 5.

FIG. 2 illustrates a construction of the latch circuits 10–12. The latch circuits 10–12 respectively include an internal clock generating portion 908 and a latch circuit portion 910. The internal clock generating portion 908 receives the CLK signal from the CPU 2, and generates an internal clock signal (e.g., an amplified or delayed CLK signal). The latch circuit portion 910 receives the internal clock signal and data (e.g., the RAS signal, the CAS signal and the WE signal), and latches the data in response to the internal clock signal.

FIG. 3 shows a detailed circuit diagram of the structure of FIG. 2. The internal clock generating portion 908 includes a buffer 100 for amplifying the CLK signal, an internal clock generator 101 for receiving an output 120 of the buffer 100 and for generating an internal clock, and inverters 900, 901 connected in series for delaying the internal clock 102.

The latch circuit portion 910 includes an inverter 905 for receiving an output 902 of the inverter 901, a buffer 300 for amplifying the data 310, and a latch circuit 907 having a clock input node C which receives an output 906 of the inverter 905, a data input node D which receives an output 304 of the buffer 300 and a data output node Q which outputs a latched data to a line 305.

There are a parasitic resistance 903 and a parasitic capacitance 904 between the output of the inverter 901 and an input of the inverter 905. Values of the parasitic resistance 903 and the parasitic capacitance 904 are relatively low if the internal clock generating portion 908 and the latch circuit portion 910 are formed relatively close together.

FIG. 4 shows a detailed circuit diagram of the internal clock generator 101 shown in FIG. 3. The internal clock generator 101 includes inverters 600–604 connected in series for receiving the output signal 120 of the buffer 100 and for providing a proper delay time, a NAND logic circuit 605 having one input connected to an output of the inverter 604 and another input which receives the output signal 120 of the buffer 100, and an inverter 606 for inverting an output signal of the NAND logic circuit 605 and for outputting an inverted signal 102 for an output signal of the internal clock generator 101.

FIGS. 5 (a)–5(b) are circuit diagrams of the latch circuit 907 shown in FIG. 3. Nodes D, C and Q shown in FIG. 5 (a) correspond to nodes D, C and Q as shown in FIG. 5 (b). As shown in FIG. 5 (b), the latch circuit 907 includes an N-type metal oxide semiconductor (MOS) transistor 501 having a gate connected to the node C and a source-drain path connected between the node D and an input of an inverter 510, an inverter 505 having an input connected to the node C, a P-type MOS transistor 502 having a gate connected to an output of the inverter 505 and a source-drain path connected between the node D and the input of the inverter 510, an inverter 507 having an input connected to an output of the inverter 510, an N-type MOS transistor 508 having a gate connected to the output of the inverter 505 and a source-drain path connected between the input of the inverter 510 and the output of the inverter 507, a P-type MOS transistor 509 having a gate connected to the node C and a source-drain path connected between the input of the inverter 510 and the output of the inverter 507, a P-type MOS transistor 503 having a gate connected to the node C and a source-drain path connected between the output of the inverter 510 and an input of an inverter 514, an N-type MOS transistor 504 having a gate connected to the output of the inverter 505 and a source-drain path connected between the output of the inverter 510 and an input of an inverter 514, an inverter 506 having an input connected to an output of the inverter 514, a P-type MOS transistor 511 having a gate connected to the output of the inverter 505 and a source-drain path connected between the input of the inverter 514 and an output of the inverter 506, and an N-type MOS transistor 512 having a gate connected to the node C and a source-drain path connected between the input of the inverter 514 and the output of the inverter 506.

FIG. 6 shows a timing chart for the circuit shown in FIG. 3, when a cycle of the CLK signal is 5 ns (e.g., a frequency is 200 MHz) and a value of the parasitic resistance 903 and the parasitic capacitance 904 are respectively about 250 Ω and 6 pF ($6\times10^{-12}$ F). In this case, a time (e.g., a delay time), from when the inverter 901 outputs a signal to when a voltage of the input of the inverter 905 becomes 90% of a high or a low level of the signal, is about 1.5 ns because $250\times6\times10^{-12}=1.5\times10^{-9}$.

As shown in FIG. 6, the CLK signal from the CPU 2 is amplified by the buffer 100 (see the signal 120 in FIG. 6). The signal 120 is delayed by the internal clock generator 101 (see the signal 102 in FIG. 6). The signal 102 has a sawtooth shape because of the parasitic resistance 903 and the parasitic capacitance 904 (see the signal 902 in FIG. 6). The inverter 905 changes the signal 906 to an inactive level (e.g., "0") when a voltage of the signal 902 becomes more than half of a reference voltage, and changes the signal 906 to an active level (e.g., "1") when a voltage of the signal 902 becomes less than half of a reference voltage (see the signal 906 in FIG. 6).

In this case, the signal 906 has a duty ratio of 50%. Therefore, the latch circuit 907 latches correctly the signal 304 as data.

However, as shown in FIG. 7, a problem occurs when the memory device 1 is connected to a CPU having a higher frequency (e.g., a 4-ns clock cycle) than that of the CPU 2. As shown in FIG. 6, 2.5 ns is needed for the signal 902 to rise from 0 voltage to the reference voltage or to fall from the reference voltage to 0 voltage. However, in this case, since the clock cycle is a 4-ns clock cycle, there is not enough time for the signal 902 to rise and fall properly. Therefore, the signal 902 cannot reach 0 voltage as shown in FIG. 7. As a result, the signal 906 cannot reach the reference voltage, and further the signal 906 does not have a duty ratio of 50%.

As a result, the latch circuit 907 latches the wrong data, and the device 1 operates erroneously because of the wrong data. Thus, it is difficult to connect a high performance CPU (e.g., a CPU operating with high frequency) to the device.

SUMMARY OF THE INVENTION

In view of the foregoing problems of the conventional method and structure, it is therefore an object of the present invention to provide an improved semiconductor device.

It is another object of the present invention to provide an improved latch circuit for latching data in response to a clock signal.

In a first aspect, a memory system according to the present invention includes a memory system having a memory cell array having a plurality of word lines connected to memory cells, a decoder for selecting one word line among the word lines in response to an address signal when the decoder receives a second control signal, and a latch circuit for receiving and latching a first control signal in response to a first clock signal and for outputting the second control signal. The latch circuit preferably includes a first latch portion for latching the first control signal during a first cycle (e.g., an even cycle) of the first clock signal, and a second latch portion for latching the first control signal during a second cycle (e.g., an odd cycle) of the first clock signal.

With the unique and unobvious structure and method of the present invention, the first latch portion latches data of the first (even) cycle, and the second latch portion latches data of the second (odd) cycle. Therefore, the latch circuit can latch data correctly even if a CPU outputs a high frequency clock signal, and the memory system can be operated correctly by the CPU.

BRIEF DESCRIPTION OF THE DRAWINGS

The foregoing and other objects, aspects and advantages will be better understood from the following detailed description of preferred embodiments of the invention with reference to the drawings, in which:

FIG. 2 is a diagram showing a RAS latch circuit 10 (as well as a CAS latch circuit 11 and a WE latch circuit) in the memory system of FIG. 1;

FIG. 3 is a circuit diagram showing a RAS latch circuit 10 (as well as a CAS latch circuit 11 and a WE latch circuit) of FIG. 2;

FIG. 13 is a circuit diagram showing a latch circuit portion of the second embodiment according to the present invention;

FIG. 14 is a circuit diagram showing a latch signal generator 312 (313) in FIG. 13.

DETAILED DESCRIPTION OF PREFERRED EMBODIMENTS OF THE INVENTION

Figure 8:
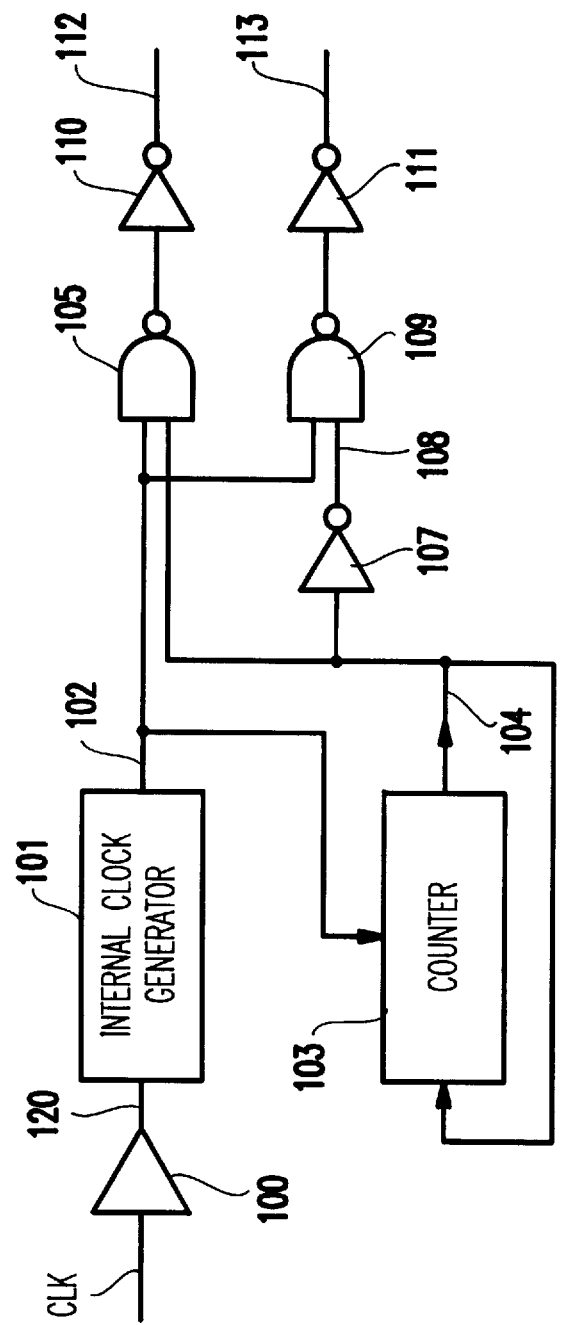
FIG. 8 is a circuit diagram showing an internal clock generating portion of a first embodiment according to the present invention.
Figure 10:
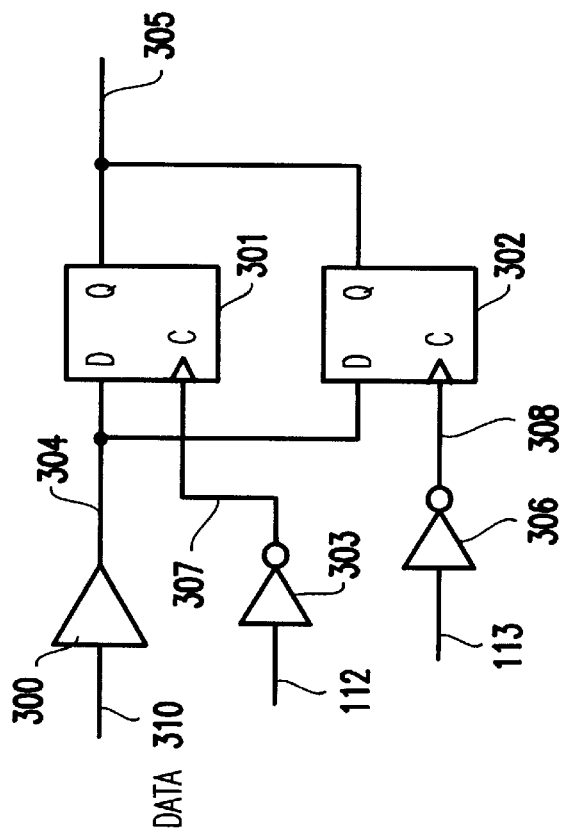
FIG. 10 is a circuit diagram showing a latch circuit portion of the first embodiment according to the present invention.
Figure 9:
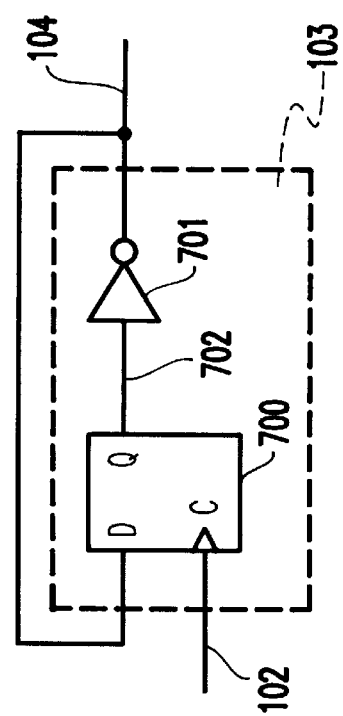
FIG. 9 is a circuit diagram showing a counter 103 in FIG. 8.

Referring now to the drawings, and more particularly to FIGS. 8–10, an internal clock generating portion and a latch circuit portion of a single-chip memory device are shown according to a first embodiment of the present invention.

Figure 1:
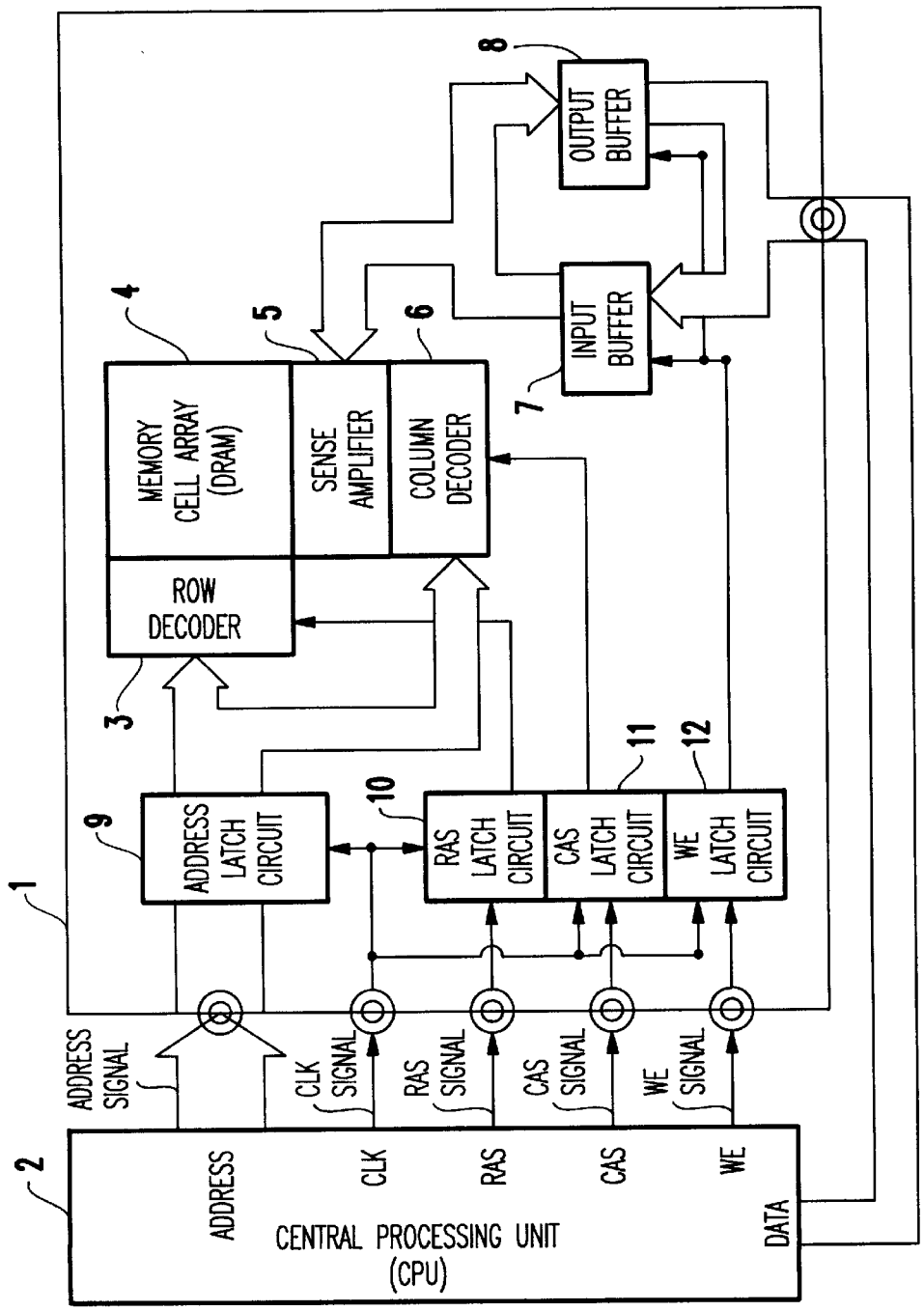
FIG. 1 illustrates a conventional memory system.

A single-chip memory device according to the invention has a construction somewhat similar to that of the single-chip memory device 1 shown in FIG. 1 except for the latch circuits corresponding to the RAS latch circuit 10, the CAS latch circuit 11, the WE latch circuit 12 and the address latch circuit 9 shown in FIG. 1. Therefore, a drawing showing the single-chip memory device according to the invention is omitted for brevity. A RAS latch circuit, a CAS latch circuit, and a WE latch circuit according to the present invention each have an internal clock generating portion and a latch circuit portion generally arranged somewhat similar to those in FIG. 2 but having a different structure. Hereinbelow, the internal clock generating portion and the latch circuit portion according to the present invention are described.

FIG. 8 illustrates an internal clock generating portion in a first embodiment of the present invention.

The internal clock generating portion includes a buffer 100 for amplifying the CLK signal, an internal clock generator 101 for receiving an output 120 of the buffer 100 and for generating an internal clock 102, a counter 103 for generating a signal 104 having a cycle two times larger than that of the internal clock 102, a NAND logic circuit 105 having an input which receives the internal clock 102 and another input which receives the signal 104, an inverter 107 for receiving the signal 104 and for outputting an inverted signal 108, a NAND logic circuit 109 having an input which receives the internal clock 102 and another input which receives the inverted signal 108, an inverter 110 having an input connected to an output of the NAND logic circuit 105 and for outputting an inverted signal 112, and an inverter 111 having an input connected to an output of the NAND logic circuit 109 and for outputting an inverted signal 113. The internal clock generator 101 has a similar construction to that shown in FIG. 4.

Figure 5A:
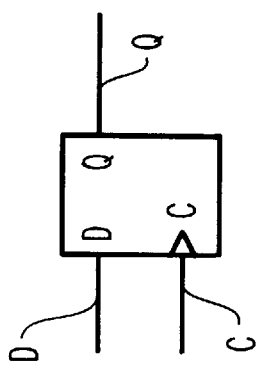
FIG. 5 (a) and 5(b) are diagrams showing a latch circuit 907 of FIG. 3.
Figure 5B:
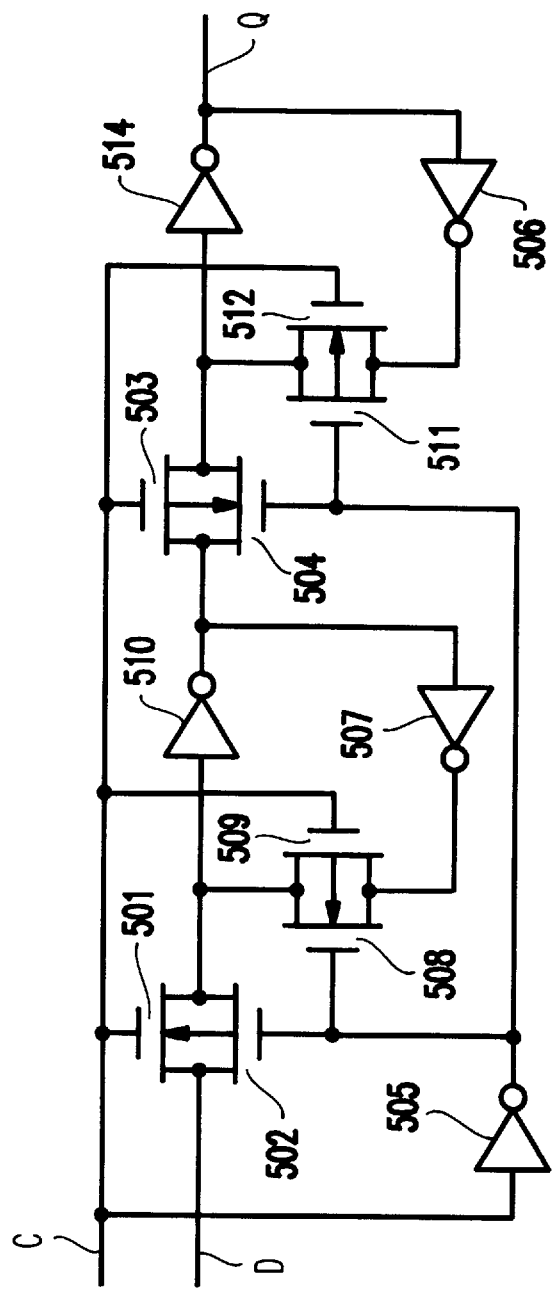
Figure 6:
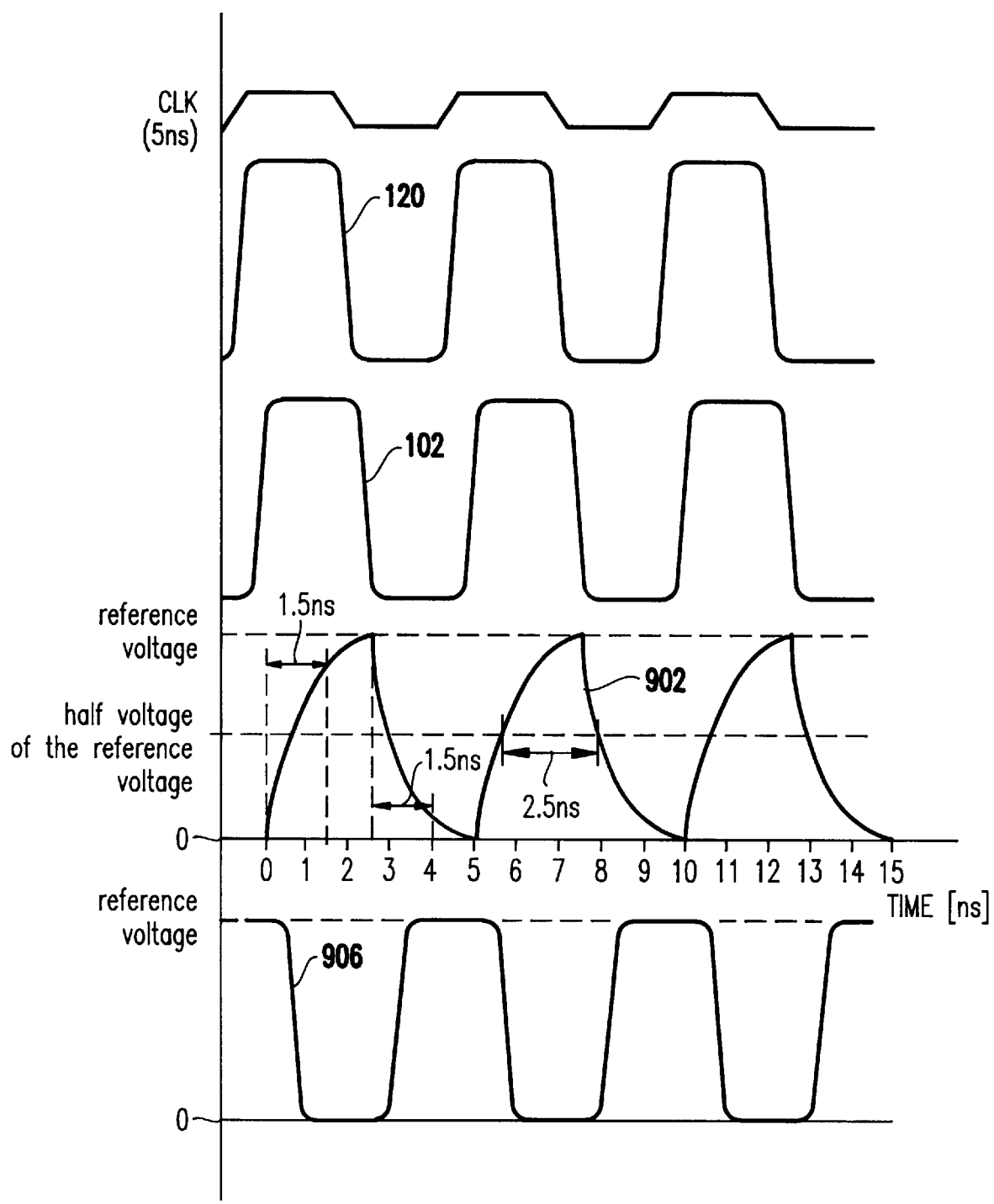
FIG. 6 is a timing chart showing a relationship between signals of the RAS latch circuit 10 (as well as a CAS latch circuit 11 and a WE latch circuit) of FIG. 3 for a 5-ns clock cycle.
Figure 7:
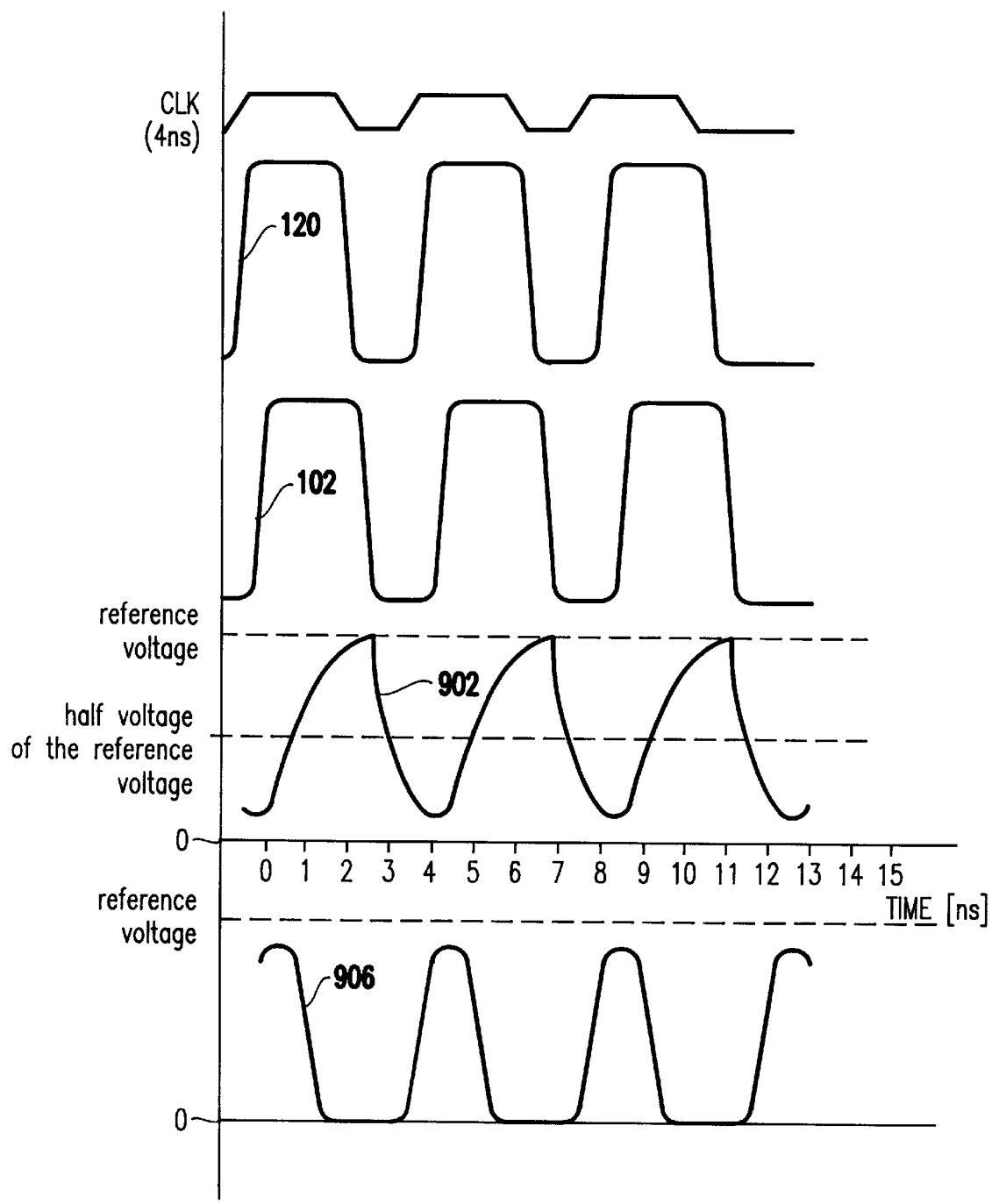
FIG. 7 is a timing chart showing a relationship between signals of the RAS latch circuit 10 (as well as a CAS latch circuit 11 and a WE latch circuit) of FIG. 3 for a 4-ns clock cycle.

FIG. 9 shows a detailed structure of the counter 103 of FIG. 8. The counter 103 includes an inverter 701 for receiving a latched data 702 of a latch circuit 700 and for outputting the signal 104, the latch circuit 700 having a clock input node C which receives the internal clock 102, a data input node D which receives the signal 104, and a data output node Q which outputs the latched data 702. The latch circuit 700 has the same construction as that shown in FIGS. 5 (a)–5(b).

FIG. 10 illustrates a latch circuit portion of a first embodiment of the present invention.

The latch circuit portion includes a buffer 300 for amplifying the data 310 and for outputting an amplified signal 304, an inverter 303 for receiving the inverted signal 112 and for outputting an inverted signal 307, an inverter 306 for receiving the inverted signal 113 and for outputting an inverted signal 308, a latch circuit 301 having a clock input node C which receives the inverted signal 307, a data input node D which receives the amplified signal 304, and a data output node Q which outputs the latched data to the line 305, and a latch circuit 302 having a clock input node C which receives the inverted signal 308, a data input node D which receives the amplified signal 304, and a data output node Q which outputs the latched data to the line 305. The latch circuits 301 and 302 have the same construction as that shown in FIGS. 5 (a) and 5(b).

Figure 11:
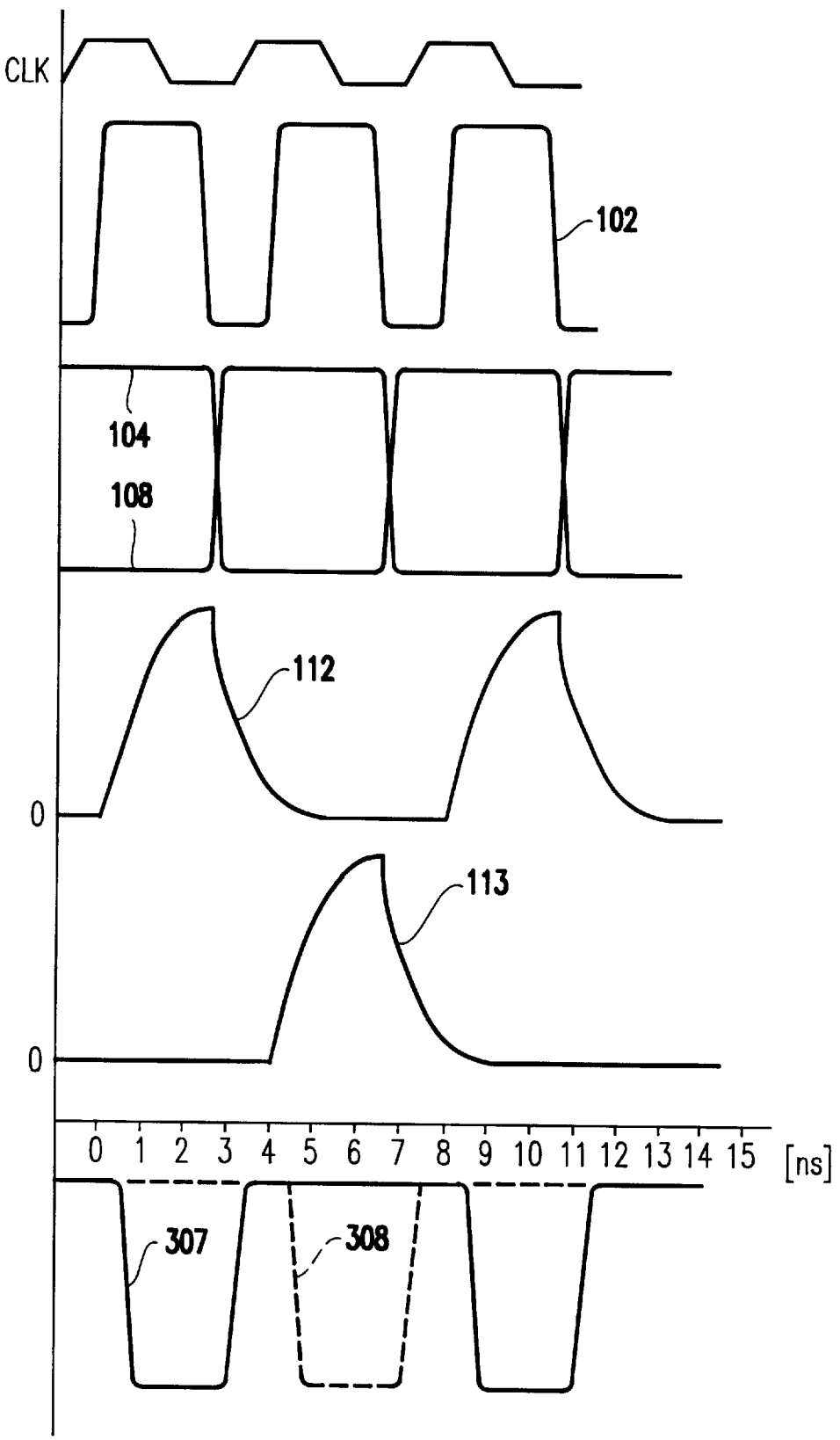
FIG. 11 is a timing chart showing a relationship between signals of an internal clock generating portion and a latch circuit portion of the first embodiment for a 4-ns clock cycle.

FIG. 11 shows a timing chart of the circuit shown in FIGS. 8–10, for a 4-ns cycle CLK signal and a value of a parasitic resistance and a parasitic capacitance are respectively about 250 Ω and 6 pF ($6 \times 10^{-12}$ F). In this case, a time (e.g., a delay time), from a time when the inverters 110 and 111 output signals to a time when voltages of the input of the inverters 303 and 306 become 90% of a high or a low level of the signal, becomes about 1.5 ns.

As shown in FIG. 11, the CLK signal, from a CPU formed externally of the memory device according to the present invention, is amplified and delayed (see the signal 102 in FIG. 11). The signals 104 and 108 have a cycle two times larger (e.g., 8 ns) than that of the signal 102 because of the counter 103. The signals 112 and 113 have a sawtooth shape because of the parasitic resistance and the parasitic capacitance (see the signals 112 and 113 in FIG. 11). The inverters 303 and 306 change the signals 112 and 113 to an inactive level (e.g., "0") when a voltage of the signals 112 and 113 becomes more than half of a reference voltage, and change the signals 112 and 113 to an active level (e.g., "1") when a voltage of the signals 112 and 113 becomes less than half of a reference voltage (see the signals 307 and 308 in FIG. 11).

Therefore, the latch circuits 301 and 302 latch data by turn (e.g., alternately) in response to the CLK signal. For example, the latch circuit 301 latches data of first (e.g., odd) cycles of the CLK signal, and the latch circuit 302 latches data of second (e.g., even) cycles of the CLK signal.

Thus, in the first embodiment, the latch circuits 301 and 302 latch data correctly. Therefore, the memory device according to the invention operates correctly even when a high performance CPU (e.g., operating with high frequency) is connected to the memory device.

Figure 12:
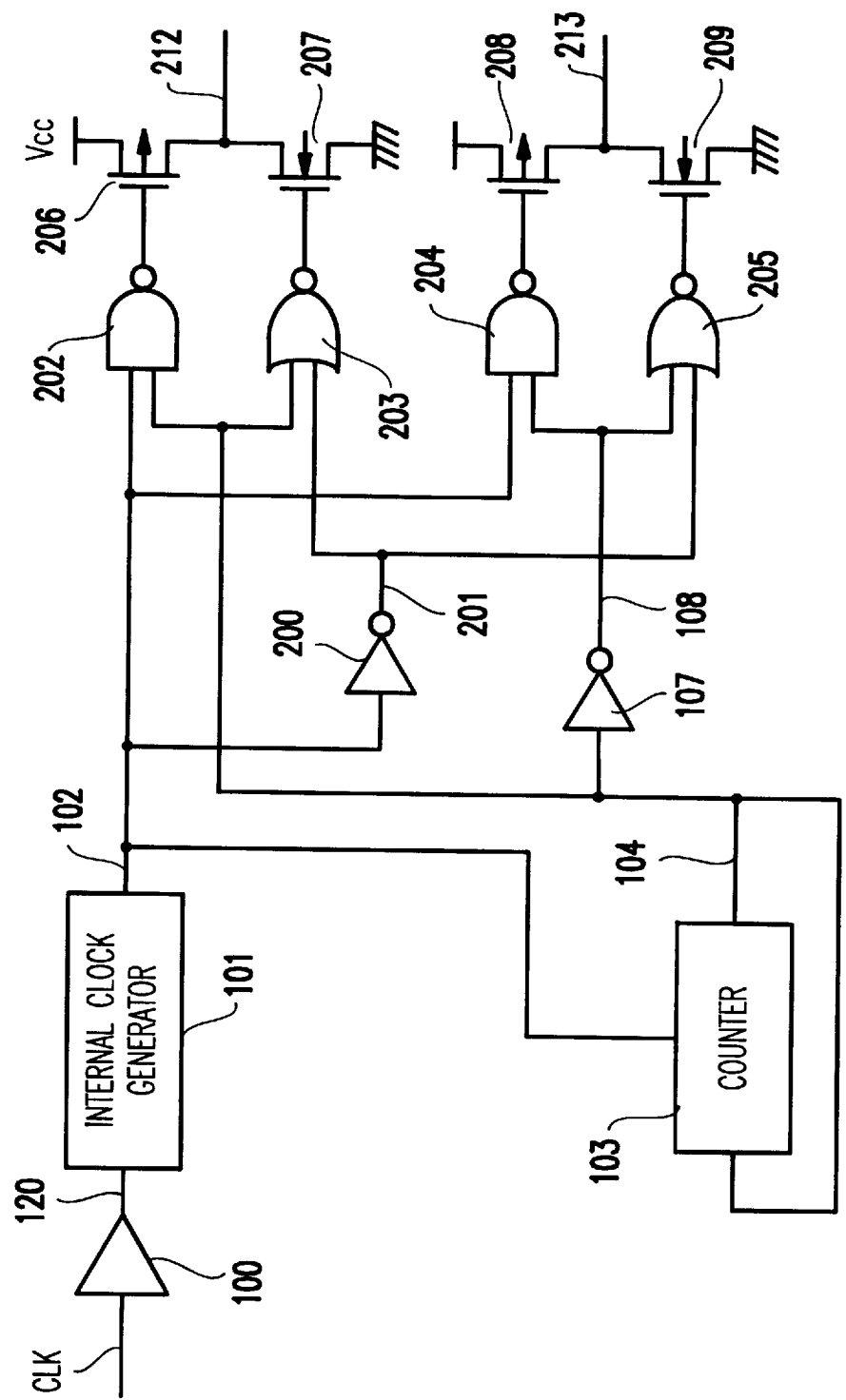
FIG. 12 is a circuit diagram showing an internal clock generating portion of a second embodiment according to the present invention.

FIGS. 12–14 illustrate a second embodiment of the present invention. The same parts in FIGS. 12–14 as those in FIGS. 8–10 are numbered with the same reference numerals as in FIG. 8–10, and, for brevity, a description of these parts is omitted hereinbelow.

FIG. 12 illustrates an internal clock generating portion in the second embodiment of the present invention. The internal clock generating portion includes a buffer 100 for amplifying the CLK signal, an internal clock generator 101 for receiving an output 120 of the buffer 100 and for generating an internal clock 102, a counter 103 for generating a signal 104 having a cycle two times larger than that of the internal clock 102, a NAND logic circuit 202 having an input which receives the internal clock 102 and another input which receives the signal 104, an inverter 107 for receiving the signal 104 and for outputting an inverted signal 108, an inverter 200 for receiving the internal clock 102 and for outputting an inverted signal 201, a NAND logic circuit 204 having an input which receives the internal clock 102 and another input which receives the inverted signal 108, a NOR logic circuit 203 having an input which receives the signal 104 and another input which receives the inverted signal 201, a NOR logic circuit 205 having an input which receives the inverted signal 108 and another input which receives the inverted signal 201, a P-type metal oxide semiconductor (MOS) transistor 206 having a gate connected to an output of the NAND logic circuit 202 and a source-drain path connected between a first reference voltage (e.g., Vcc) and a line 212, an N-type MOS transistor 207 having a gate connected to an output of the NOR logic circuit 203 and a source-drain path connected between a second reference voltage (e.g., ground) and the line 212, a P-type MOS transistor 208 having a gate connected to an output of the NAND logic circuit 204 and a source-drain path connected between the first reference voltage (e.g., Vcc) and a line 213, and an N-type MOS transistor 209 having a gate connected to an output of the NOR logic circuit 205 and a source-drain path connected between the second reference voltage (e.g., ground) and the line 213.

Figure 4:
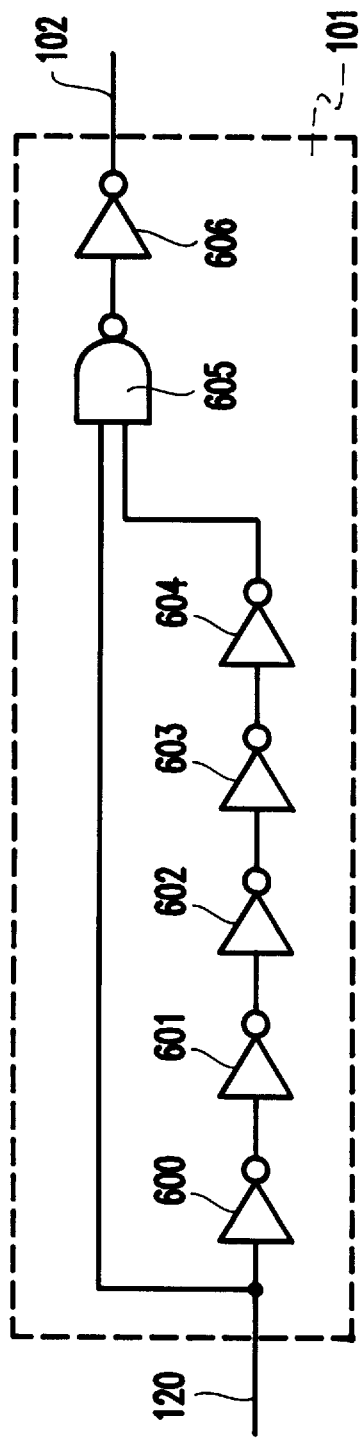
FIG. 4 is a circuit diagram showing an internal clock generator 101 of FIG. 3.

The internal clock generator 101 preferably has the same construction as that shown in FIG. 4, and the counter 103 preferably has the same construction as that shown in FIG. 9.

FIG. 13 illustrates a latch circuit portion in the second embodiment of the present invention.

The latch circuit portion includes a buffer 300 for amplifying the data 310 and for outputting an amplified signal 304, a latch signal generator 312 having an input connected to the line 212 and for outputting a signal 307 having a predetermined pulse width, a latch signal generator 313 having an input connected to the line 213 and for outputting a signal 308 with a predetermined delay time, the latch circuit 301 having a clock input node C which receives the signal 307, a data input node D which receives the amplified signal 304, and a data output node Q which outputs the latched data to the line 305, and the latch circuit 302 having a clock input node C which receives the signal 308, a data input node D which receives the amplified signal 304, and a data output node Q which outputs the latched data to the line 305. The latch circuits 301 and 302 have the same construction as that shown in FIGS. 5(a) and 5(b).

FIG. 14 shows a detailed structure of the latch signal generators 312 and 313 of FIG. 13. The latch signal generators 312 and 313 respectively include inverters 800–804 connected in series for providing a proper delay time, and a NAND logic circuit 805 having an input connected to an output of the inverter 804 and another input connected to the lines 212 and 213. The outputs of the NAND logic circuits 805 of the generators 312, 313 respectively represent the signals 307 and 308. An input of the inverters 800 is connected to the corresponding lines 212 and 213.

Figure 15:
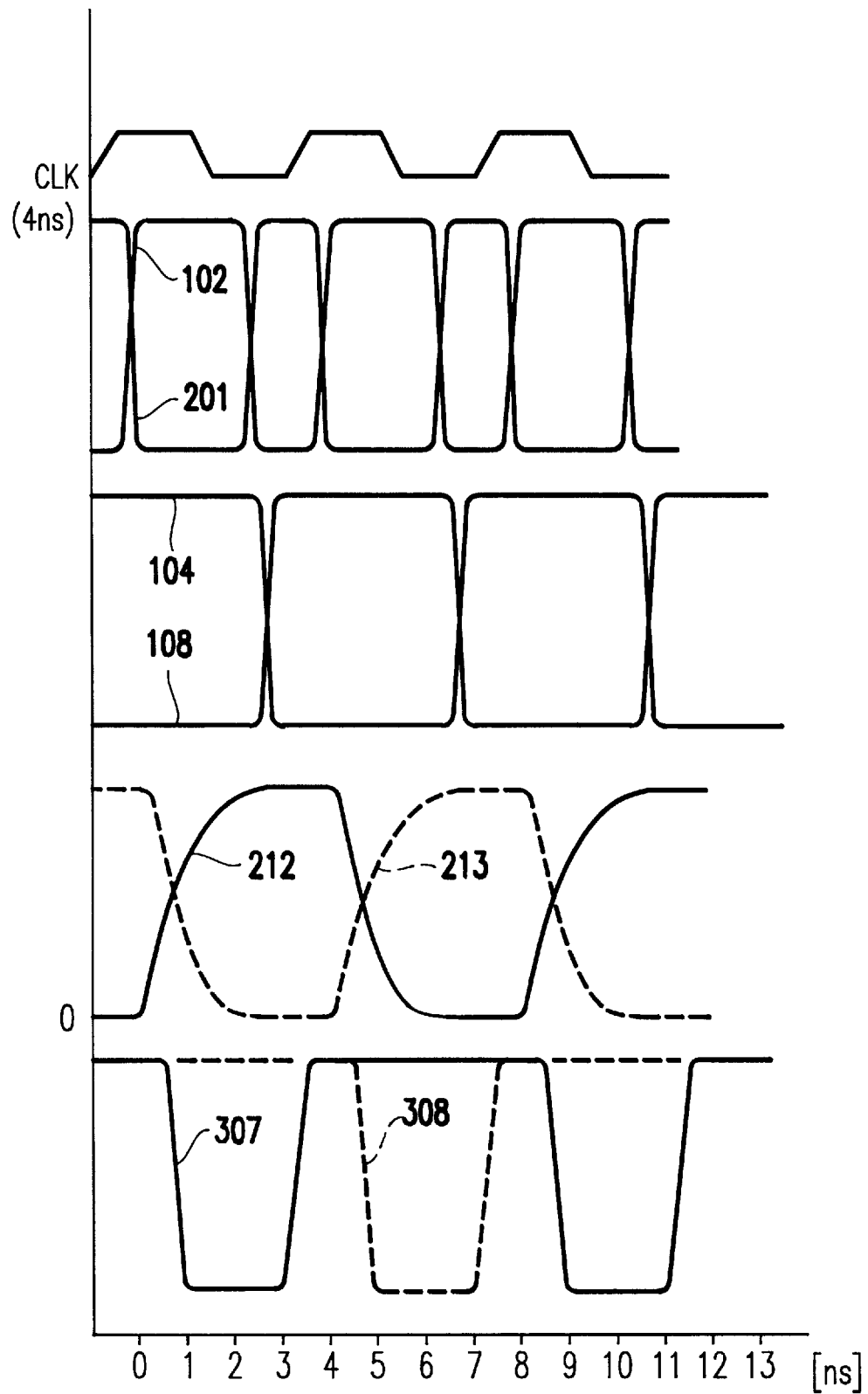
FIG. 15 is a timing chart showing a relationship between signals of an internal clock generating portion and a latch circuit portion of the second embodiment for a 4-ns clock cycle.

FIG. 15 shows a timing chart for the circuit shown in FIGS. 12–14, for a 4-ns CLK signal cycle and a value of a parasitic resistance and a parasitic capacitance are respectively about 250 Ω and 6 pF ($6 \times 10^{-2}$ F). In this case, a time (e.g., a delay time), from when the MOS transistors 206 and 207 (or 208 and 209) output a signal to the line 212 (or the line 213) to when a voltage of the input of the latch signal generators 312 and 313 becomes 90% of a high or a low level of the signal, becomes about 1.5 ns.

As shown in FIG. 15, the CLK signal, from a CPU formed externally of the memory device according to the present invention, is amplified and delayed (see the signals 102 and 201 in FIG. 15). The signals 104 and 108 have a cycle two times larger (e.g., 8 ns) than that of the signal 102 because of the counter 103. The signals on the lines 212 and 213 have a sawtooth shape because of the parasitic resistance and the parasitic capacitance (see the signals 212 and 213 in FIG. 15). The inverters 303 and 306 change the signals 112 and 113 to an inactive level (e.g., "0") when a voltage of the signal 112 and 113 becomes more than half of a reference voltage, and change the signals 112 and 113 to an active level (e.g., "1") when a voltage of the signal 112 and 113 becomes less than half of a reference voltage (see the signals 307 and 308 in FIG. 11).

Therefore, the latch circuit 301 and 302 latch data by turn (e.g., alternately) in response to the CLK signal. For example, the latch circuit 301 latches data of first (e.g., odd) cycles of the CLK signal, and the latch circuit 302 latches data of second (e.g., even) cycles of the CLK signal. Further, the latch signal generators 312 and 313 generate signals 307 and 308 at a predetermined timing to make the latch circuits 301 and 302 latch data correctly.

Therefore, the memory device according to the invention operates more correctly and preferably when a high performance CPU (e.g., a CPU operating with high frequency) is connected to the memory device.

Hereinabove, the internal clock generating portion and the latch circuit portion have been described in connection with the RAS, CAS and WE latch circuits. However, as known by one of ordinary skill in the art taking the present specification as a whole, these circuits may be used for the other apparatus according to the device design and designer requirements. Also, as known by one of ordinary skill in the art taking the present specification as a whole, the value of the parasitic resistance and the parasitic capacitance and the clock cycle from the CPU may be changed according to the device design and designer requirements.

While the invention has been described in terms of several preferred embodiments, those skilled in the art will recognize that the invention can be practiced with modification within the spirit and scope of the appended claims.

Having thus described my invention, what I claim as new and desire to secure by Letters Patent is as follows:

1. A memory system comprising:
    a memory cell array having a plurality of word lines connected to memory cells;
    a latch circuit for receiving and latching a first control signal in response to a first clock signal and for outputting a second control signal; and
    a decoder for selecting one word line among said word lines in response to an address signal when said decoder receives the second control signal,
    wherein said latch circuit comprises:
        a first latch portion for latching the first control signal during a first cycle of the first clock signal; and
        a second latch portion for latching the first control signal during a second cycle of the first clock signal.

2. The system as recited in claim 1, wherein said latch circuit further comprises an internal clock generating portion for generating second and third clock signals based on the first clock signal, said first and second latch portions respectively latching the first control signal in response to the second and the third clock signals.

3. The system as recited in claim 2, wherein said internal clock generating portion comprises:
    an internal clock generator for generating a first internal clock signal by using the first clock signal;
    a counter for receiving the first internal clock signal and for generating a second internal clock signal having a cycle larger than that of the first internal clock signal;
    a first NAND logic circuit having a first input for receiving the first internal clock signal and a second input for receiving the second internal clock signal, and an output for outputting the second clock signal; and
    a second NAND logic circuit having a first input for receiving the first internal clock signal and a second input for receiving an inverted signal of the second internal clock signal, and an output for outputting the third clock signal.

4. The system as recited in claim 3, wherein said first latch portion comprises a first circuit having a clock input node for receiving the second clock signal, a data input node for receiving the first control signal, and a data output node for outputting the second control signal.

5. The system as recited in claim 4, wherein said second latch portion comprises a second circuit having a clock input node for receiving the third clock signal, a data input node for receiving the first control signal, and a data output node for outputting the second control signal.

6. The system as recited in claim 5, wherein said counter comprises:
    a third circuit having a clock input node for receiving the first internal clock signal, a data input node for receiving the second internal clock signal, and a data output node; and a first inverter for receiving an output of said data output node of said third circuit and for outputting the second internal clock signal.

7. The system as recited in claim 6, wherein said first, second and third circuits respectively comprise:

a first metal oxide semiconductor (MOS) transistor having a gate connected to said clock input node and a source-drain path connected between said data input node and an input of a second inverter;

a third inverter having an input connected to said clock input node;

a second MOS transistor having a gate connected to an output of said third inverter and a source-drain path is connected between said data input node and said input of said second inverter;

a fourth inverter having an input connected to an output of said second inverter;

a third MOS transistor having a gate connected to said output of said third inverter and a source-drain path connected between said input of said second inverter and said output of said fourth inverter;

a fourth MOS transistor having a gate connected to said clock input node and a source-drain path connected between said input of said second inverter and said output of said fourth inverter;

a fifth MOS transistor having a gate connected to said clock input node;

a fifth inverter coupled to said fifth MOS transistor, said fifth MOS transistor having a source-drain path connected between said output of said second inverter and an input of said fifth inverter;

a sixth MOS transistor having a gate connected to said output of said third inverter and a source-drain path connected between said output of said second inverter and said input of said fifth inverter;

a sixth inverter having an input connected to an output of said fifth inverter;

a seventh MOS transistor having a gate connected to said output of said third inverter and a source-drain path connected between said input of said fifth inverter and an output of said sixth inverter; and an eighth MOS transistor having a gate connected to said clock input node and a source-drain path connected between said input of said fifth inverter and said output of said sixth inverter, wherein said output of said fifth inverter is connected to said data output node.

8. The system as recited in claim 7, wherein said first, third, sixth and eighth MOS transistors respectively comprise a first conductivity-type MOS transistor, and said second, fourth, fifth and seventh MOS transistors respectively comprise a second conductivity-type MOS transistor.

9. The system as recited in claim 8, wherein said first conductivity-type comprises an N-type, and said second conductivity-type comprises a P-type.

10. The system as recited in claim 9, wherein said internal clock generator comprises:

a delay circuit for receiving the first clock signal and for outputting a delayed signal;

a third NAND logic circuit having a first input for receiving the first clock signal and a second input for receiving the delayed signal; and a seventh inverter for receiving an output of said third NAND logic circuit and for outputting the first internal clock signal.

11. The system as recited in claim 1, wherein said system is formed in a single semiconductor chip.

12. The system as recited in claim 1, wherein the first clock signal and the first control signal are outputted by an off-chip central processing unit.

13. The system as recited in claim 2, wherein said internal clock generating portion comprises:

an internal clock generator for generating a first internal clock signal based on the first clock signal;

a counter for receiving the first internal clock signal and for generating a second internal clock signal having a cycle larger than that of the first internal clock signal;

a first NAND logic circuit having a first input for receiving the first internal clock signal and a second input for receiving the second internal clock signal;

a second NAND logic circuit having a first input for receiving the first internal clock signal and a second input for receiving an inverted signal of the second internal clock signal;

a first NOR logic circuit having a first input for receiving the second internal clock signal and a second input for receiving an inverted signal of the first internal clock signal;

a second NOR logic circuit having a first input for receiving the inverted signal of the second internal clock signal and a second input for receiving the inverted signal of the first internal clock signal;

a first metal oxide semiconductor (MOS) transistor having a gate for receiving an output of said first NAND logic circuit and a source-drain path connected between a first reference voltage and a first node;

a second MOS transistor having a gate for receiving an output of said first NOR logic circuit and a source-drain path connected between a second reference voltage and said first node;

a third MOS transistor having a gate for receiving an output of said second NAND logic circuit and a source-drain path connected between said first reference voltage and a second node; and a fourth MOS transistor having a gate for receiving an output of said second NOR logic circuit and a source-drain path connected between said second reference voltage and said second node, wherein the second clock signal is outputtted from said first node, and the third clock signal is outputtted from said second node.

14. The system as recited in claim 13, wherein said first latch portion comprises:

a first latch signal generator for receiving the second clock signal and for outputting a first latch signal; and a first circuit having a clock input node for receiving the first latch signal, a data input node for receiving the first control signal, and a data output node for outputting the second control signal.

15. The system as recited in claim 14, wherein said second latch portion comprises:

a second latch signal generator for receiving the third clock signal and for outputting a second latch signal; and a second circuit having a clock input node for receiving the second latch signal, a data input node for receiving the first control signal, and a data output node for outputting the second control signal.

16. The system as recited in claim 15, wherein said first latch signal generator comprises:

a first delay circuit for receiving the second clock signal and for outputting a first delayed signal; and a third NAND logic circuit having a first input for receiving the second clock signal and a second input for receiving the first delayed signal, wherein the first latch signal is outputted from an output of said third NAND logic circuit.

17. The system as recited in claim 16, wherein said second latch signal generator comprises:

a second delay circuit for receiving the third clock signal and for outputting a second delayed signal; and a fourth NAND logic circuit having a first input for receiving the third clock signal and a second input for receiving the second delayed signal, wherein the second latch signal is outputted from an output of said fourth NAND logic circuit.

18. The system as recited in claim 17, wherein said counter comprises:

a third circuit having a clock input node for receiving the first internal clock signal, a data input node for inputting the second internal clock signal, and a data output node; and a first inverter for receiving an output of said data output node of said third circuit and for outputting the second internal clock signal.

19. The system as recited in claim 18, wherein said first, second and third circuits respectively comprise:

a fifth metal oxide semiconductor (MOS) transistor having a gate connected to said clock input node;

a second inverter coupled to said first MOS transistor, said first MOS transistor having a source-drain path connected between said data input node and an input of said second inverter;

a third inverter having an input connected to said clock input node;

a sixth MOS transistor having a gate connected to an output of said third inverter and a source-drain path connected between said data input node and said input of said second inverter;

a fourth inverter having an input connected to an output of said second inverter;

a seventh MOS transistor having a gate connected to said output of said third inverter and a source-drain path connected between said input of said second inverter and said output of said fourth inverter;

an eighth MOS transistor having a gate connected to said clock input node and a source-drain path connected between said input of said second inverter and said output of said fourth inverter;

a ninth MOS transistor having a gate connected to said clock input node and a source-drain path connected between said output of said second inverter and an input of a fifth inverter;

a tenth MOS transistor having a gate connected to said output of said third inverter and a source-drain path connected between said output of said second inverter and said input of said fifth inverter;

a sixth inverter having an input connected to an output of said fifth inverter;

an eleventh MOS transistor having a gate connected to said output of said third inverter and a source-drain path connected between said input of said fifth inverter and an output of said sixth inverter; and a twelfth MOS transistor having a gate connected to said clock input node and a source-drain path connected between said input of said fifth inverter and said output of said sixth inverter, wherein said output of said fifth inverter is connected to said data output node.

20. The system as recited in claim 19, wherein said fifth, seventh, tenth and twelfth MOS transistors respectively comprise a first conductivity-type MOS transistor, and said sixth, eighth, ninth and eleventh MOS transistors respectively comprise a second conductivity type MOS transistor.

21. The system as recited in claim 20, wherein said first conductivity-type comprises an N-type, and said second conductivity-type comprises a P-type.

22. The system as recited in claim 21, wherein said internal clock generator comprises:

a delay circuit for receiving the first clock signal and for outputting a delayed signal;

a fifth NAND logic circuit having a first input for receiving the first clock signal and a second input for receiving the delayed signal; and a seventh inverter for receiving an output of said third NAND logic circuit and for outputting the first internal clock signal.

23. The system as recited in claim 22, wherein the first clock signal and the first control signal are outputted by an off-chip central processing unit.

* * * * *